(12) United States Patent
Anthony et al.

(10) Patent No.: US 12,713,940 B2
(45) Date of Patent: Aug. 18, 2026

(54) POWER SEMICONDUCTOR DEVICE ATTACHED TO A LEAD FRAME

(71) Applicant: NEXPERIA B.V., Nijmegen (NL)

(72) Inventors: Matthew Lloyd Anthony, Nijmegen (NL); Ricardo Lagmay Yandoc, Nijmegen (NL); Manoj Balakrishnan, Nijmegen (NL); Adam Richard Brown, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 765 days.

(21) Appl. No.: 17/870,560

(22) Filed: Jul. 21, 2022

(65) Prior Publication Data

US 2023/0025949 A1 Jan. 26, 2023

(30) Foreign Application Priority Data

Jul. 22, 2021 (EP) .................................... 21187091

(51) Int. Cl.

| | |
|---|---|
| ***H10W 70/20*** | (2026.01) |
| ***H10W 70/40*** | (2026.01) |
| ***H10W 72/00*** | (2026.01) |
| ***H10W 72/30*** | (2026.01) |
| ***H10W 72/60*** | (2026.01) |
| ***H10W 74/00*** | (2026.01) |
| *H10W 90/00* | (2026.01) |

(52) U.S. Cl.

CPC ....... *H10W 70/466* (2026.01); *H10W 70/481* (2026.01); *H10W 72/30* (2026.01); *H10W 72/60* (2026.01); *H10W 74/00* (2026.01); *H10W 72/07636* (2026.01); *H10W 90/766* (2026.01)

(58) Field of Classification Search

CPC ......... H01L 23/49524; H01L 23/49562; H01L 23/3107; H01L 24/40; H01L 24/84; H01L 24/37; H01L 2924/181; H01L 2924/13091; H01L 23/49555; H01L 23/49513; H01L 2224/84801; H10W 70/466; H10W 70/481; H10W 74/00; H10W 72/60; H10W 72/30

See application file for complete search history.

(56) References Cited

U.S. PATENT DOCUMENTS

| | | | | |
|---|---|---|---|---|
| 6,777,800 | B2 | 8/2004 | Madrid et al. | |
| 8,049,312 | B2 * | 11/2011 | Herbsommer .......... | H01L 24/41 257/713 |
| 9,275,921 | B2 * | 3/2016 | Miyakawa .............. | H01L 23/28 |
| 2004/0080028 | A1 | 4/2004 | Yanagisawa | |

(Continued)

FOREIGN PATENT DOCUMENTS

| | | |
|---|---|---|
| EP | 3584832 | 7/2004 |

OTHER PUBLICATIONS

Extended European Search Report for corresponding European application EP21187091.0, 9 pages dated Jan. 18, 2022.

*Primary Examiner* — Alonzo Chambliss
(74) *Attorney, Agent, or Firm* — Ruggiero McAllister & McMahon LLC

(57) ABSTRACT

A semiconductor device is provided that includes a lead frame, a die attached to the lead frame using a first solder, a clip attached to the die using a second solder, and a copper slug attached to the clip. First gull wing leads are attached to the leadframe for a drain connection of the semiconductor device. Second gull wing leads are attached to the clip for a gate connection and for a source connection of the semiconductor device.

13 Claims, 3 Drawing Sheets

(56) References Cited

U.S. PATENT DOCUMENTS

| | | | | |
|---|---|---|---|---|
| 2004/0135237 | A1 | 7/2004 | Funato et al. | |
| 2008/0087992 | A1 | 4/2008 | Shi et al. | |
| 2010/0164078 | A1* | 7/2010 | Madrid | H01L 24/37 438/122 |
| 2010/0176508 | A1* | 7/2010 | Herbsommer | H01L 23/49562 438/122 |
| 2020/0350272 | A1 | 11/2020 | Hong et al. | |

* cited by examiner

POWER SEMICONDUCTOR DEVICE ATTACHED TO A LEAD FRAME

CROSS REFERENCE TO RELATED APPLICATION

This application claims the benefit under 35 U.S.C. § 119(a) of European Application No. 21187091.0 filed Jul. 22, 2021, the contents of which are incorporated by reference herein in their entirety.

BACKGROUND OF THE DISCLOSURE

1. Field of the Disclosure

The present disclosure relates to a semiconductor device. The disclosure also relates to a method of manufacturing of a semiconductor device.

2. Description of the Related Art

A known loss free package (LFPAK) semiconductor device is described in U.S. Pat. No. 6,777,800B2. A semiconductor die is mounted to a lead frame with leads. Wires couple the semiconductor die to the leads. The wires, the semiconductor die and then the most of the lead frame are then encapsulated in a molding material. The molding material is then shaped. The formed semiconductor die package includes a molded body that has leads extending laterally away from the molded body. The semiconductor die package is mounted onto a circuit board.

As consumer electronics (e.g., cell phones, laptop computers, etc.) continue to decrease in size, there is an ever increasing demand for thinner electronic devices and thinner electronic components. In addition, the heat dissipation properties of a semiconductor die package should be improved. For example, power semiconductor devices such as vertical MOSFETs (metal oxide field effect transistors) can generate a significant amount of heat. For high output power applications (e.g., more than 60 Watts), special packaging is required to remove heat from the power transistor to prevent overheating. Overheating can also degrade the operational characteristics of a power transistor.

In one embodiment described in the above mentioned patent a semiconductor die package comprises: (a) a semiconductor die comprising a first surface, a second surface, and a vertical power MOSFET having a gate region and a source region at the first surface, and a drain region at the second surface; (b) a drain clip having a major surface and being electrically coupled to the drain region; (c) a gate lead electrically coupled to the gate region; (d) a source lead electrically coupled to the source region; and (e) a non-conductive molding material encapsulating the semiconductor die, wherein the major surface of the drain clip is exposed through the non-conductive molding material.

In another embodiment of the above mentioned patent a semiconductor die package comprises: (a) a semiconductor die comprising a first surface, a second surface, and a vertical power MOSFET having a gate region and a source region at the first surface, and a drain region at the second surface; (b) a drain clip having a major surface and being electrically coupled to the drain region; (c) a drain lead electrically coupled to an end of the drain clip; (d) a gate lead electrically coupled to the gate region; (e) a source lead structure including at least one source lead and a protruding region having a major surface, and a die attach surface opposite the major surface of the source lead structure, the die attach surface being electrically coupled to the source region; and (f) a non-conductive molding material encapsulating the semiconductor die, wherein the major surface of the drain clip is exposed through the non-conductive molding material.

Another known semiconductor device is shown in FIG. 1. The device comprises an inverted MOSFET package, with an exposed drain tab 3e on the top of the device with gull wing leads 3.

SUMMARY

Various example embodiments are directed to the disadvantage as described above and/or others which may become apparent from the following disclosure.

According to an embodiment of this disclosure a semiconductor device comprises a lead frame, a die attached to the lead frame using a first solder, a clip attached to the die using a second solder, and a copper slug attached to the clip. The clip and the copper slug can be stamped from a single piece of copper. First gull wing leads are attached to the leadframe for a drain connection of the semiconductor device. Second gull wing leads are attached to the clip for a gate connection and for a source connection of the semiconductor device. The semiconductor device can further comprise an exposed source pad which is attached to a PCB.

A semiconductor device can be a power MOS semiconductor device, which can be used in the automotive industry.

The semiconductor device as described above has the exposed bottom source pad. Such a source pad on the bottom of the semiconductor device can be directly soldered to the PCB, and this directly contributes to an improved thermal performance of the semiconductor device since dual cool techniques are provided. Furthermore a board level reliability (BLR) is enhanced by providing an extra solder joint between the PCB and the package.

The semiconductor device has an exposed top drain pad. This exposed top drain pad can be used with a heatsink, which secures an improved heat dissipation and thermal performance. This also allows a higher power output and increased device density on the PCB.

Furthermore, the semiconductor device comprises additional gull-wing leads for the source and gate connections. Gull-wing leads are used to absorb some of the physical stresses imposed on the semiconductor devices, which secures an improved BLR performance.

According to an embodiment of the disclosure a method of producing a semiconductor device comprises the steps:

- stencil printing of a solder on a leadframe matrix,
- attaching a die to the leadframe,
- stencil printing of a solder to the die,
- attaching a clip to the die, which clip forms a top pad,
- providing a moulding of the leadframe in a book mold press,
- polishing through the top of the package wherein a top drain is exposed, and
- singulation of the package wherein gull-wing leads are formed.

The clip is a dual gauge, which can be achieved by welding, soldering, or any other suitable method. An ultrasonic welding (USW) can be used to make a dual gauge clip.

The semiconductor device produced by such a method has the same advantages as described above for the semiconductor device embodiment.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale.

Advantages of the subject matter claimed will become apparent to those skilled in the art upon reading this description in conjunction with the accompanying figures, in which like reference numerals have been used to designate like elements, and in which:

DETAILED DESCRIPTION

An embodiment of the present disclosure relates to a design and manufacturing of a source-down and dual cooled metal—oxide—semiconductor field-effect transistor (MOSFET) package with eight gull wing leads. This MOSFET package comprises a large area source pad that is directly connected on a printed circuit board (PCB) pad, wherein additional source leads and gate lead will be formed in a gull wing design for better board level reliability.

Figures 2A, 2B, 2C:
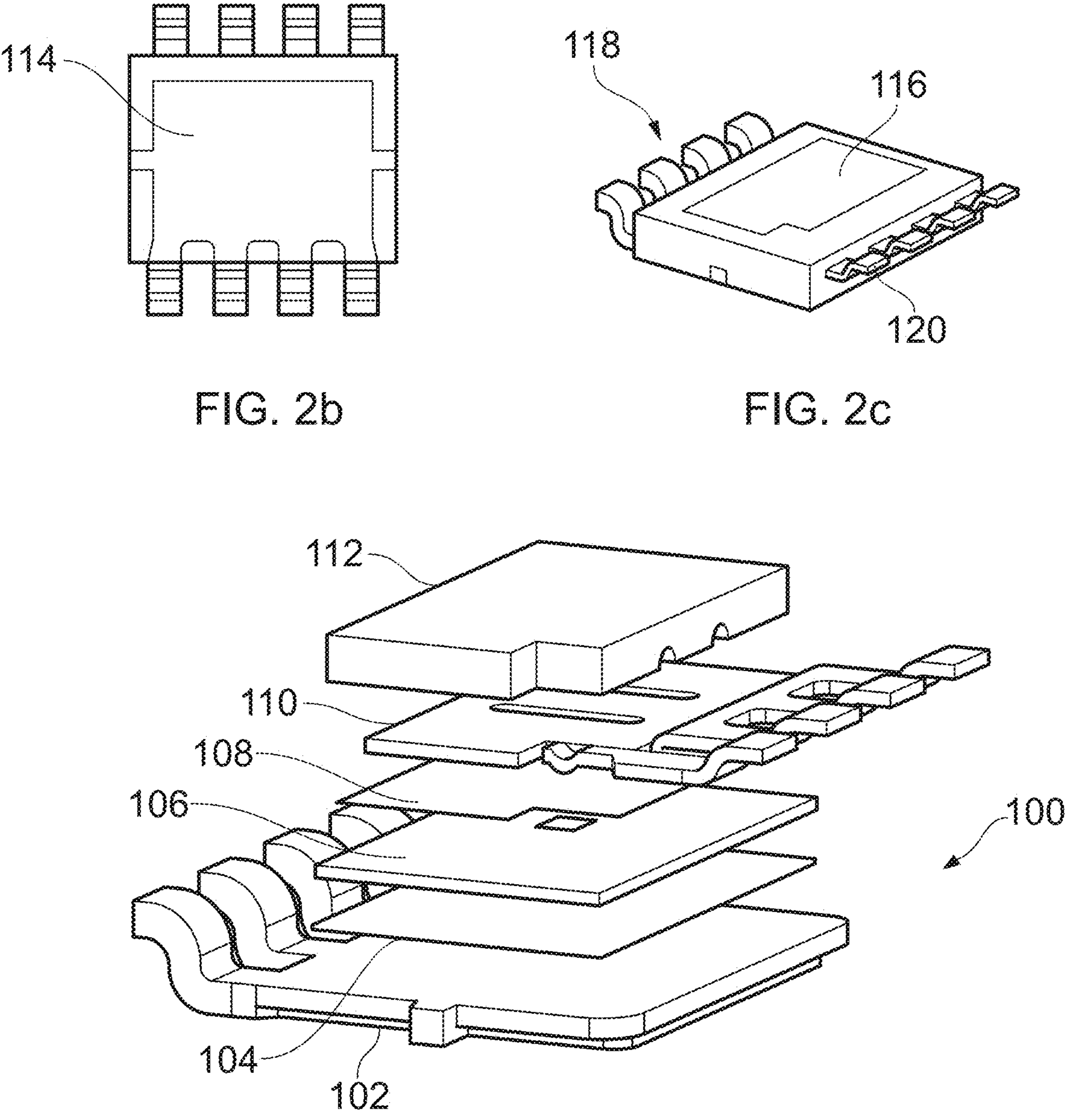
FIGS. 2*a*, 2*b* and 2*c* illustrate a semiconductor device according to an embodiment of the present disclosure.

A semiconductor device 100 according to an embodiment of the present disclosure is shown in FIGS. 2*a*, 2*b* and 2*c*. FIG. 2*a* shows the components of the semiconductor device in a top-bottom view, FIG. 2*b* shows the top view of the semiconductor device and FIG. 2*c* shows a bottom view of the semiconductor device.

A semiconductor device 100, in this particular embodiment a source-down and dual cooled MOSFET package, comprises:

- a leadframe 102,
- a die attach solder 104,
- a die 106, which die is attached to the leadframe 102 via the die attach solder 104,
- a clip attach solder 108,
- a clip 110, which clip is attached to the die 106 via the clip attach solder 108, and
- a coper slug 112.

The clip 110 and the copper slug 112 can be realized as a fused single copper element.

An exposed copper pad 114 on the top of the package, which exposed copper pad 114 is a face of the leadframe 102, is shown in FIG. 2*b*.

In the bottom view of the semiconductor device 100 shown in FIG. 2*c*, an exposed source pad 116 (without a gate), gull wing leads for a drain 118, and gull wing leads for a gate and a source 120 are shown. The exposed source pad 116 is a face of the copper slug 112.

The essential features of the present disclosure are the exposed source pad, the exposed top drain connection and the gull-wing leads for the gate connection and the source connection.

The package according to the embodiment of the present disclosure provides multiple benefits. In particular the two exposed pads on the top and bottom of the device allow significantly better thermal performance and therefore improved power ratings of the package and the semiconductor device. The extra provided PCB bonds via the gull wing gate and source leads, and source pad connection significantly increase the board level reliability.

Compared to a known loss free package (LFPAK) design, the present disclosure provides three main features.

The first feature is the exposed bottom source pad. A source pad on the bottom of the semiconductor device is directly soldered to the PCB, and this directly contributes to an improved thermal performance of the semiconductor device since dual cool techniques are provided. At the same time the BLR is enhanced by providing an extra solder joint between the PCB and the package.

The second feature is an exposed top drain pad. This exposed top drain pad is used with a heatsink. This provides improved heat dissipation and thermal performance. Furthermore this allows a higher power output and increased device density on the PCB.

The third feature are additional gull-wing leads for the source and gate connections. Gull-wing leads are used to absorb some of the physical stresses imposed on the semiconductor devices, which secures an improved BLR performance.

Figure 1:
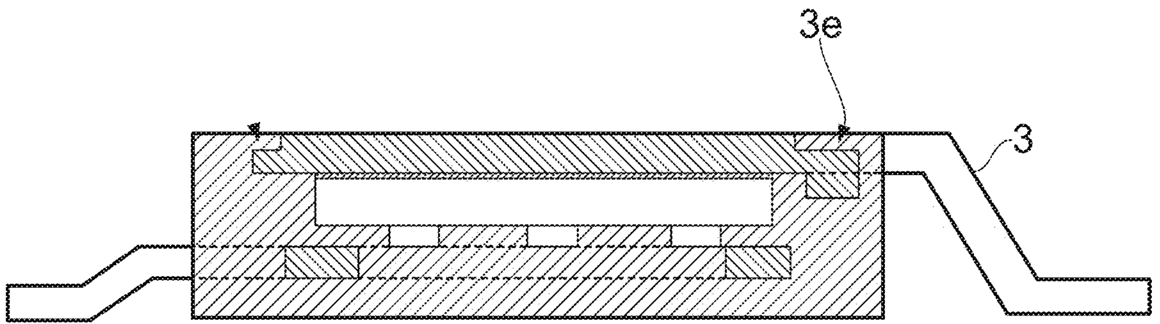
FIG. 1 shows a known semiconductor device.

Compared to the semiconductor device shown in FIG. 1, the semiconductor device according to the embodiment of the present disclosure comprises an exposed source pad only at the bottom of package as well as an exposed drain pad on the top with gull wing leads. There is no exposed gate pad on the package plastic body, but instead it is implemented by the gull wing leads which secured significantly improved BLR.

Figure 3:
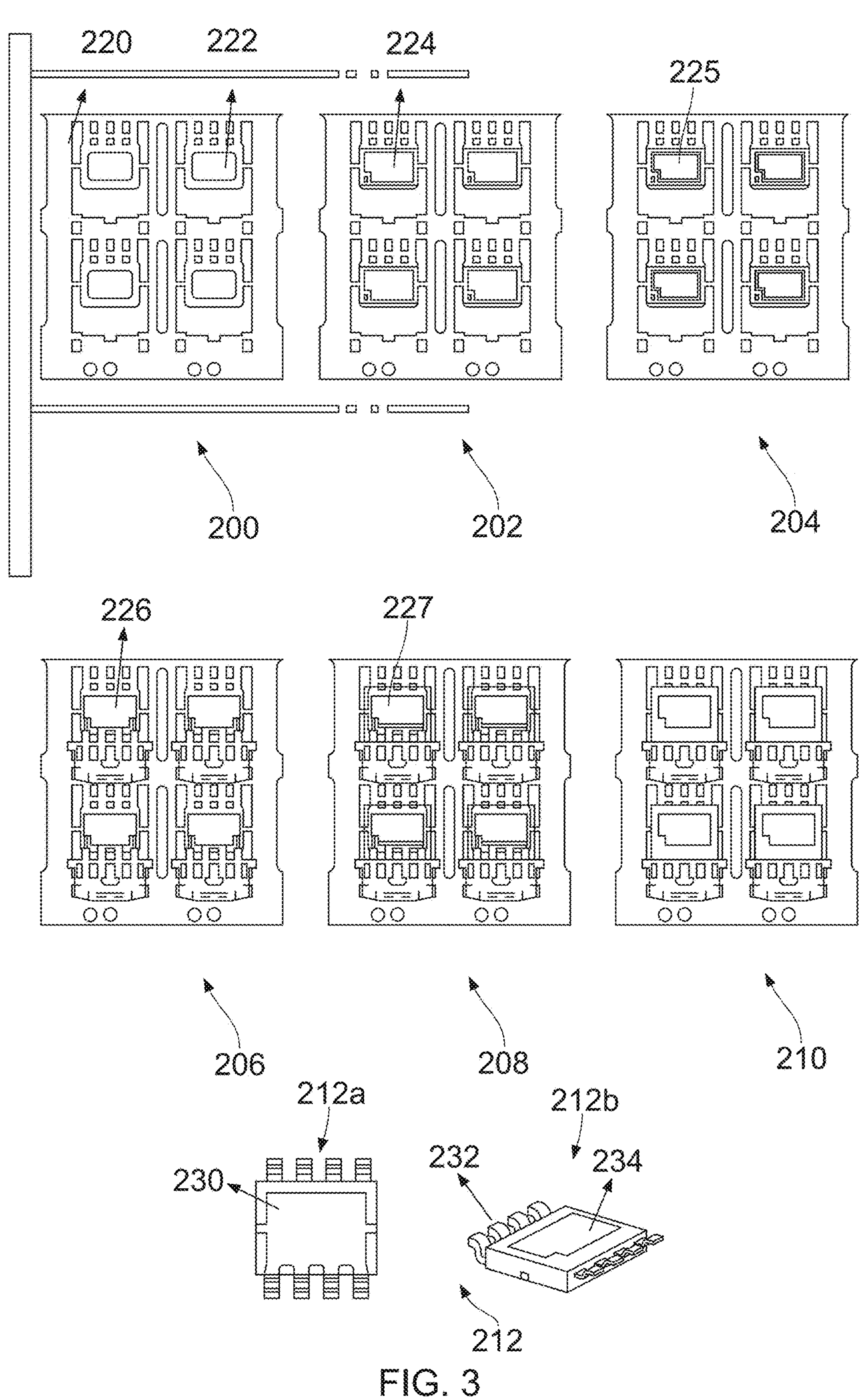
FIG. 3 illustrates a method of manufacturing of a semiconductor device according to an embodiment of the present disclosure.

The present disclosure also relates to a method of manufacturing of a semiconductor device. The method comprises the following steps:

- reference number 200 in FIG. 3: stencil printing of a solder 222 on a leadframe matrix 220,
- reference number 202 in FIG. 3: attaching a die 224 to the leadframe 220,
- reference number 204 in FIG. 3: stencil printing of a solder 225 to the die 224,
- reference number 206 in FIG. 3: attaching a clip 226, wherein such a clip can be created by ultrasonic welding (USW) to the die 224, or soldering of two pieces of copper, or stamping a single piece of copper, etc., wherein the clip forms a top pad,
- reference number 208 in FIG. 3: providing a moulding 227 of the leadframe in a book mold press,
- reference number 210 in FIG. 3: polishing through the top of the package wherein a top drain is exposed, and
- reference number 212 in FIG. 3: singulation of the package wherein gull-wing leads are formed, wherein
  - reference number 212*a* represents a top view of the semiconductor device, wherein an exposed copper pad 230 is visible,
  - reference number 212*b* represents a bottom view of the semiconductor device, wherein gull wing leads 232 and an exposed source pad 234 are visible.

Such a semiconductor device produced by the above described method comprises an exposed source pad only at the bottom of package, and an exposed drain pad on the top with gull wing leads. Such a semiconductor device secures significantly improved BLR.

A semiconductor device according to an embodiment of the present disclosure is especially advantageous for power MOS semiconductor devices used at the automotive markets.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A semiconductor device comprising:

a lead frame;

a die attached to the lead frame using a first solder;

a clip attached to the die using a second solder;

a copper slug attached to the clip, wherein the copper slug has an exposed face that forms an exposed source pad at a bottom surface of the semiconductor device; and an exposed drain pad exposed through moulding at a top surface of the semiconductor device, wherein the lead frame has first gull wing leads attached for a drain connection of the semiconductor device.

2. The semiconductor device as claimed in claim 1, wherein the clip and the copper slug are stamped from a single piece of copper.

3. The semiconductor device as claimed in claim 2, wherein the clip has second gull wing leads attached for a gate connection and for a source connection of the semiconductor device.

4. The semiconductor device as claimed in claim 2, wherein the semiconductor device comprises the exposed source pad which is attached to a PCB.

5. The semiconductor device as claimed in claim 2, wherein the semiconductor device is a power MOS semiconductor device.

6. The semiconductor device as claimed in claim 1, wherein the clip has second gull wing leads attached for a gate connection and for a source connection of the semiconductor device.

7. The semiconductor device as claimed in claim 6, wherein the semiconductor device is a power MOS semiconductor device.

8. The semiconductor device as claimed in claim 6, wherein the semiconductor device comprises the exposed source pad which is attached to a PCB.

9. The semiconductor device as claimed in claim 1, wherein the semiconductor device comprises the exposed source pad which is attached to a PCB.

10. The semiconductor device as claimed in claim 9, wherein the semiconductor device is a power MOS semiconductor device.

11. The semiconductor device as claimed in claim 1, wherein the semiconductor device is a power MOS semiconductor device.

12. A method of producing a semiconductor device, the method comprising the steps of:

stencil printing of a solder on a leadframe matrix;

attaching a die to the leadframe;

stencil printing of a solder to the die;

attaching a clip to the die, which clip forms a top pad;

providing a moulding of the leadframe in a book mold press to form a package;

polishing through the top of the package wherein a top drain is exposed; and singulation of the package wherein gull-wing leads are formed.

13. The method of producing a semiconductor device as claimed in claim 12, wherein an ultrasonic welding (USW) is used to make a dual gauge clip.

* * * * *